United States Patent

Rothweil et al.

[11] Patent Number: 5,982,795
[45] Date of Patent: Nov. 9, 1999

[54] EXCIMER LASER HAVING POWER SUPPLY WITH FINE DIGITAL REGULATION

[75] Inventors: Daniel A. Rothweil; Igor V. Fomenkov, both of San Diego, Calif.

[73] Assignee: Cymer, Inc., San Diego, Calif.

[21] Appl. No.: 08/995,832

[22] Filed: Dec. 22, 1997

[51] Int. Cl.[6] .................................................. H01S 3/00
[52] U.S. Cl. .............................. 372/38; 372/37; 372/55; 372/57
[58] Field of Search ................................ 372/25, 37, 38, 372/55, 57, 58

[56] References Cited

U.S. PATENT DOCUMENTS

| | | | |
|---|---|---|---|
| 4,258,334 | 3/1981 | McCusker et al. | 372/57 X |
| 4,549,091 | 10/1985 | Fahlen et al. | 372/38 X |
| 4,606,034 | 8/1986 | Eden et al. | 372/57 |
| 4,611,327 | 9/1986 | Clark et al. | 372/58 |
| 4,710,939 | 12/1987 | Birnbach et al. | 372/73 |
| 4,740,982 | 4/1988 | Hakuta et al. | 372/59 |
| 4,964,137 | 10/1990 | Aramaki et al. | 372/59 |
| 5,138,622 | 8/1992 | Friede et al. | 372/38 |
| 5,142,543 | 8/1992 | Wakabayashi et al. | 372/32 |
| 5,463,650 | 10/1995 | Ito et al. | 372/57 |
| 5,642,374 | 6/1997 | Wakabayashi et al. | 372/57 |
| 5,710,787 | 1/1998 | Amada et al. | 372/25 |
| 5,729,562 | 3/1998 | Birx et al. | 372/38 |

*Primary Examiner*—Brain Healy
*Attorney, Agent, or Firm*—John R. Ross, Esq.

[57] ABSTRACT

An excimer laser system having a laser chamber containing elongated electrodes and an excimer laser gas and a high voltage pulse power supply having fine digital regulation for supplying high voltage electrical pulses to the electrodes. The high voltage pulse power supply includes a power supply and a magnetic switch circuit for compressing and amplifying the output of the power supply. The power supply includes a silicon controlled rectifier which provides a direct current output to an inverter which converts the output of the silicon controlled rectifier to high frequency alternating current which is in turn amplified by a step up transformer. An output stage diode rectifier in combination with an inductor converts this high frequency high voltage current back to direct current. A control board comprising electronic circuits controls the power supply to provide high voltage pulses at a frequency of at least 1000 Hz. A voltage feedback circuit detects the voltage output of the output stage rectifier and provides a voltage output signal to the control board and a current feedback circuit detects charging current flowing in the output stage diode rectifier and provides a charging current signal to the control board. A digital command control for providing command control to said control board. A preferred embodiment of the present invention achieves very precise regulation with the use of differential instrumentation amplifiers in the feedback circuits and by reducing the charging current near the end of the charging cycle of each pulse.

9 Claims, 11 Drawing Sheets

EXCIMER LASER HAVING POWER SUPPLY WITH FINE DIGITAL REGULATION

This invention relates to excimer lasers and especially to excimer lasers requiring precise pulse energy control.

BACKGROUND OF THE INVENTION

Electric discharge lasers such as excimer lasers require high voltage power supplies. A prior art typical simplified electric circuit for an excimer laser is shown in FIG. 1. The electric circuit includes a magnetic switch circuit and a power supply for the magnetic switch circuit. A block representing a 1 kV prior art power supply for the laser is shown at 2 in FIG. 1. A more detailed description of the prior art power supply is shown in FIG. 2A and FIG. 2B.

In the typical prior art laser system, the power supply 2 provides high voltage pulses of about 600 volts lasting about 0.2 milliseconds at frequencies such as 1000 Hz. The magnetic switch circuit shown in FIG. 1 compresses and amplifies these pulses to produce electrical discharges across the electrodes of the laser as shown at 4. These discharge pulses across the electrodes are typically about 20,000 volts with duration of about 20 ns. A typical KrF excimer laser with the proper gaseous medium between the electrodes, such as 0.1 percent fluorine, 1.0 percent krypton and about 99 percent neon, the laser produces ultraviolet laser pulses at a wavelength of about 248 nm and an energy-per-pulse of about 10 mJ.

For many applications of excimer lasers such as the light source for integrated circuit lithography, precise control of the laser pulse energy is very important. The laser pulse energy over the typical operating range of the laser is approximately proportional to the discharge voltage which in turn is approximately proportional to the power supply output voltage. Thus, the stability of the output pulse energy is dependent on the stability of the power supply voltage. A great variety of power supply devices are available to supply electric power at controlled currents and voltages to a wide variety of equipment.

Maintaining constant power supply output voltage when the laser is operating continuously at a specific repetition rate, such as 1000 Hz, is a challenge for laser suppliers. This task is made much more difficult when the laser is operated in a pulse mode. A typical pulse mode is one in which the laser is required to produce bursts of about 50 pulses at a rate of 1000 KHz during the bursts with the bursts being separated by a "dead time" of a fraction of a second to a few seconds. When operating in a continuous mode, the best prior art output voltage variation is in the range of about 0.6 percent (about 3 to 3.5 volts). When operating in the pulse mode, the variation during the first few pulses is about 2.5 percent (about 12 to 15 volts).

In a typical lithography excimer laser, a feedback control system measures the output laser pulse energy, determines the degree of deviation from a desired pulse energy, and then sends a signal to a controller to adjust the power supply voltage so that energy of subsequent pulses are closer to desired energy. In prior art systems, this feedback signal is an analog signal and it is subject to noise produced by the laser environment. This noise can result in erroneous power supply voltages being provided and can in turn result in increased variation in the output laser pulse energy.

At many self service gasoline stations, the pump shuts down when the quantity of gasoline purchased has been pumped. A well known technique used at these stations is to slow down the gasoline fill rate when the quantity pumped approaches to within a small quantity of the amount purchased.

What is needed is a better fast finely regulated power supply for equipment such as excimer lasers requiring a fast, precise pulse power source.

SUMMARY OF THE INVENTION

The present invention provides an excimer laser system having a laser chamber containing elongated electrodes and an excimer laser gas and a high voltage pulse power supply having fine digital regulation for supplying high voltage electrical pulses to the electrodes. The high voltage pulse power supply includes a power supply and a magnetic switch circuit for compressing and amplifying the output of the power supply. The power supply includes a silicon controlled rectifier which provides a direct current output to an inverter which converts the output of the silicon controlled rectifier to high frequency alternating current which is in turn amplified by a step up transformer. An output stage diode rectifier in combination with an inductor converts this high frequency high voltage current back to direct current. A control board comprising electronic circuits controls the power supply to provide high voltage pulses at a frequency of at least 1000 Hz. A voltage feedback circuit detects the voltage output of the output stage rectifier and provides a voltage output signal to the control board and a current feedback circuit detects charging current flowing in the output stage diode rectifier and provides a charging current signal to the control board. A digital command control for providing command control to said control board. A preferred embodiment of the present invention achieves very precise regulation with the use of differential instrumentation amplifiers in the feedback circuits and by reducing the charging current near the end of the charging cycle of each pulse.

DETAILED DESCRIPTION OF PREFERRED EMBODIMENTS

Preferred embodiments of the present invention can be described by reference to the figures.

First Preferred Embodiment—High Repetition Rate Pulsed Power Supply

As stated above, in a typical prior art commercial 600 volt power supply the output voltage can be regulated to provide output pulses to an accuracy of about 0.6 percent when operated continuously. Noise in analog feedback circuits can typically add significant additional unwanted variation to the power supply output voltage especially when operated in a pulse mode. The following embodiment of the present invention provides a high repetition rate pulsed power supply with overall power supply output regulation in the range of 0.1% or less. This is accomplished by electronic circuit improvements and by digitalizing the command circuit to eliminate inverter noise.

Figure 2A:
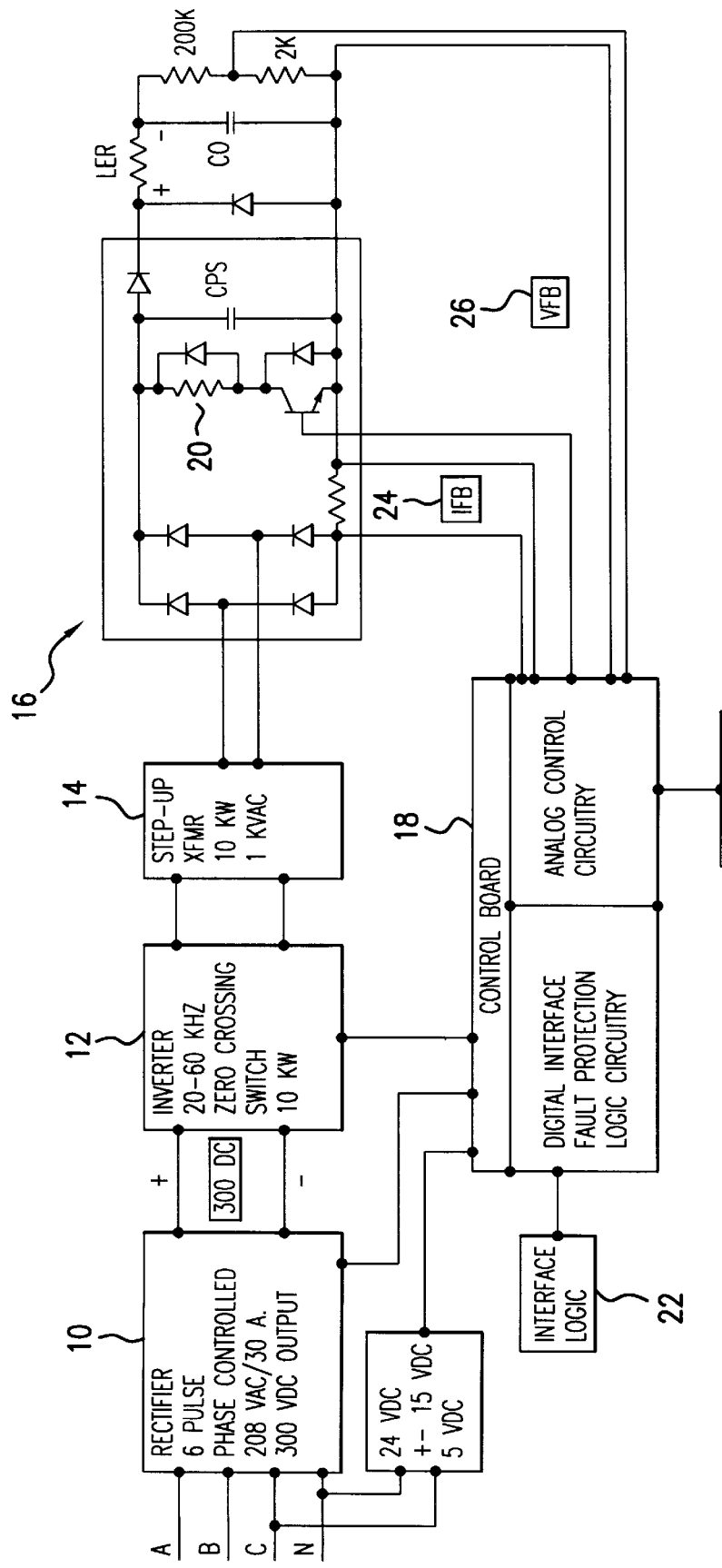
FIG. 2A is a circuit diagram of a typical prior art power supply.
Figure 2B:
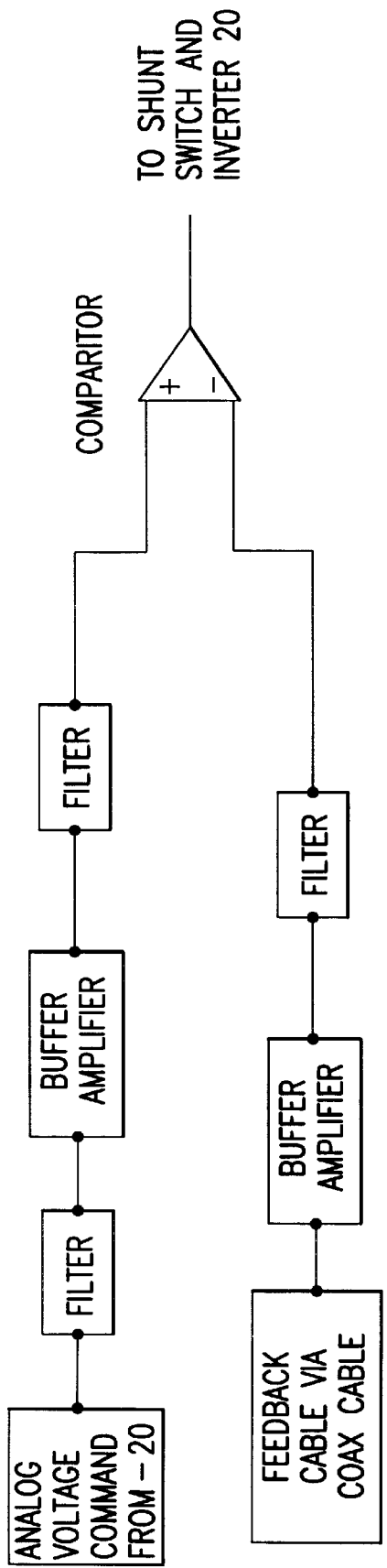
FIGS. 2B–2C are circuit diagrams of prior art feedback circuits.
Figure 2C:
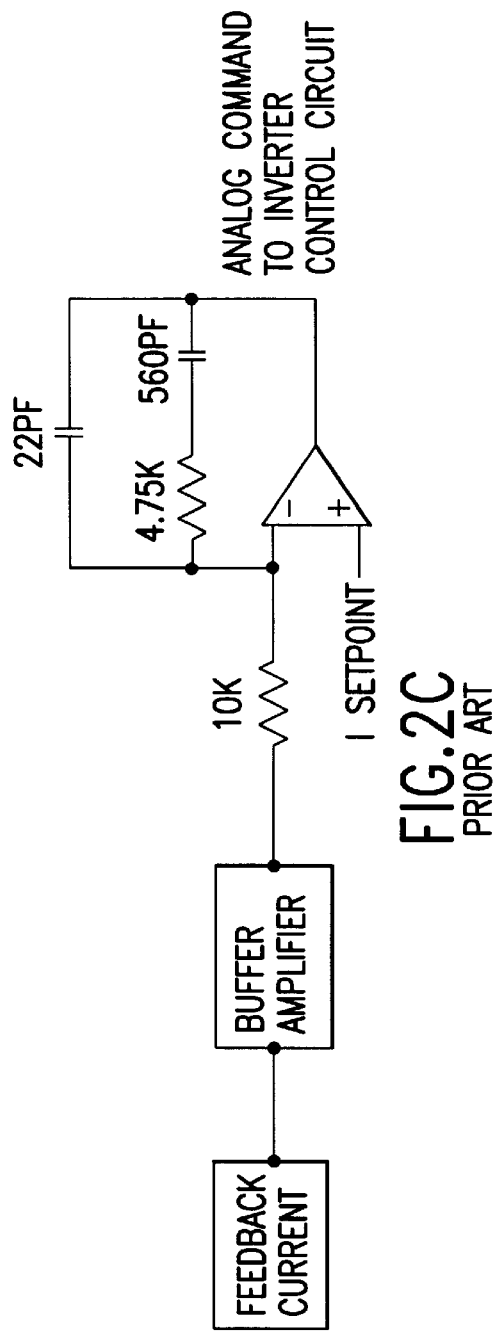
Figure 6:
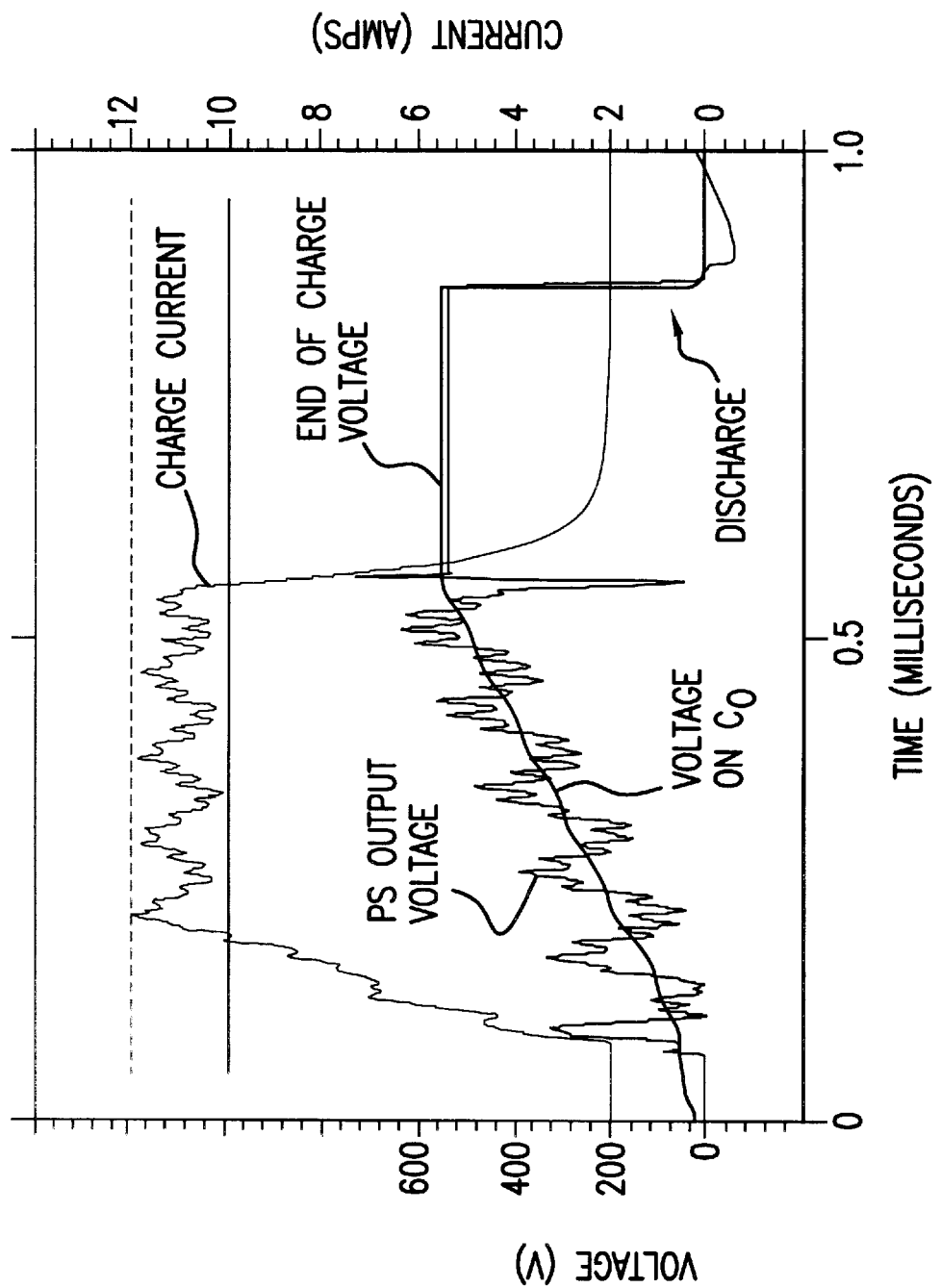
FIG. 6 is a drawing showing a typical prior art charging cycle.

FIG. 2A is a block diagram of a prior art power supply useful for providing high frequency, high voltage pulses to power a current commercial lithography excimer laser. The principal components of the power supply are: a silicon control rectifier 10 powered at 208 $V_{AC}$ with an output up to 300 $V_{DC}$, a zero crossing switched 10 KW inverter 12 which converts the DC voltage to an alternating current voltage at a frequency of 60 KHz, a 10 KW stepup transformer 14 that steps up the voltage to 1000 $V_{AC}$, and a 10 KV output stage diode rectifier 16 with a shunt switch. A control board 18 provides the control of the power supply, control board 18 receives its instructions from an external control unit 20 which provides an analog signal from an operator and feedback control based on laser pulse energy. Analog input to control board 18 is also provided by voltage and current feedback signals as shown at 24 and 26 in FIG. 2A. An interface logic circuit 22 provides digital interface instructions which may be provided by a control processor of a lithography stepper machine. As shown in FIG. 2A, control board 18 receives feedback voltage and current output signals from rectifier 16. These signals are used by control board 18 as feedback signals to control the power supply output. When Co has been charged to the desired level, the circuits of control board 18 interrupt the operation of inverter 12 as shown in FIG. 2C and fire the shunt switch S2 in rectifier 16 as shown in FIG. 2A. FIG. 6 is an example of a current and voltage traces during a charging cycle for a prior art pulse power supply.

"Rev O" Circuit Changes

Applicants have discovered that a resonant frequency in the current feedback circuit was creating substantial voltage transients during burst operation of the prior art power supply units. To reduce these transients, Applicants changed two resistors in the current feedback control circuit as is shown by a comparison of FIG. 3B and prior art FIG. 2B. Specifically, the 10 k ohm resistor was changed to 30 k ohms and the 4.75 k ohm resistor was changed to 100 ohms. Applicants refer to this change as "Rev O". This minor change caused a very substantial reduction in the transient voltage variation during burst mode operation as will be discussed later.

Digital Command Control

Figure 3A:
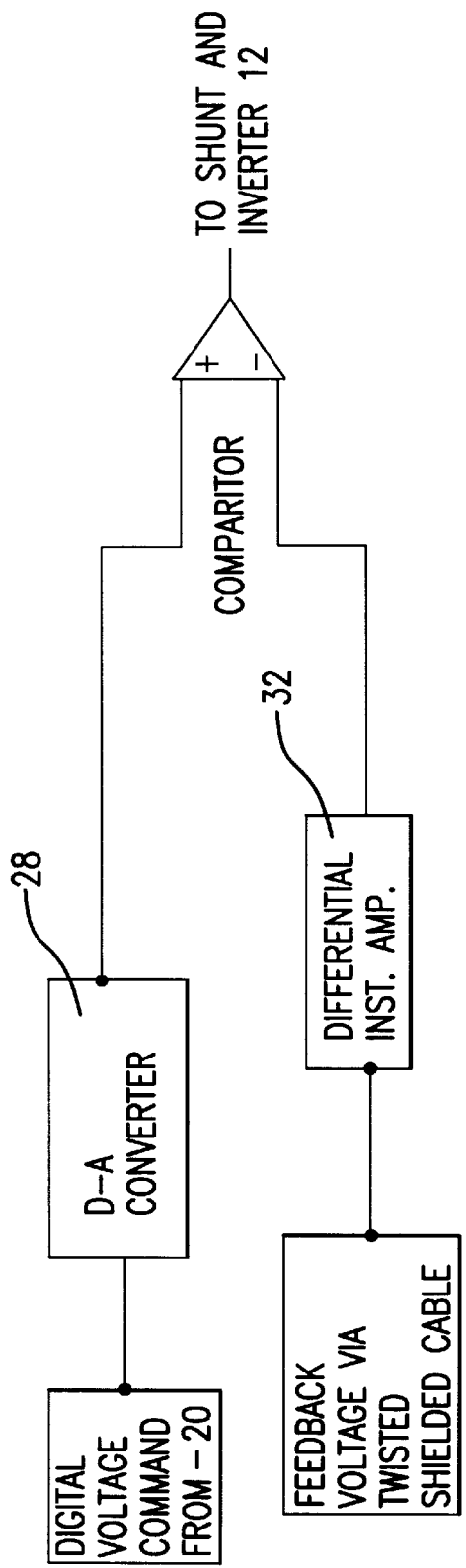
FIGS. 3A and 3B are circuit diagrams showing features of the present invention.

Applicants discovered that the prior art analog voltage command circuits were being degenerated by noise sources associated with the laser system. A simple solution to this problem was to convert the command control to a digital signal which is transmitted to the power supply unit where it is converted to an analog signal as shown in FIG. 3A by digital to analog converter 28 to operate diode rectifier 16 shunt switch S2 for fast control of the power supply electronics. In this preferred embodiment, the feedback voltage on Co is processed through a differential instrumentation amplifier 32 and is compared to the voltage control signal sent digitally from the voltage command unit 20 in order to derive a trip signal to operate the rectifier 16 shunt switch 25 and inhibit the operation of inverter 12. The command voltage is transmitted to the power supply in a 12 bit format which provides an accuracy of 0.025 percent. This change provided another major reduction in transient variations as will be discussed below.

Differential Instrumentation Amplifiers

Figure 3B:
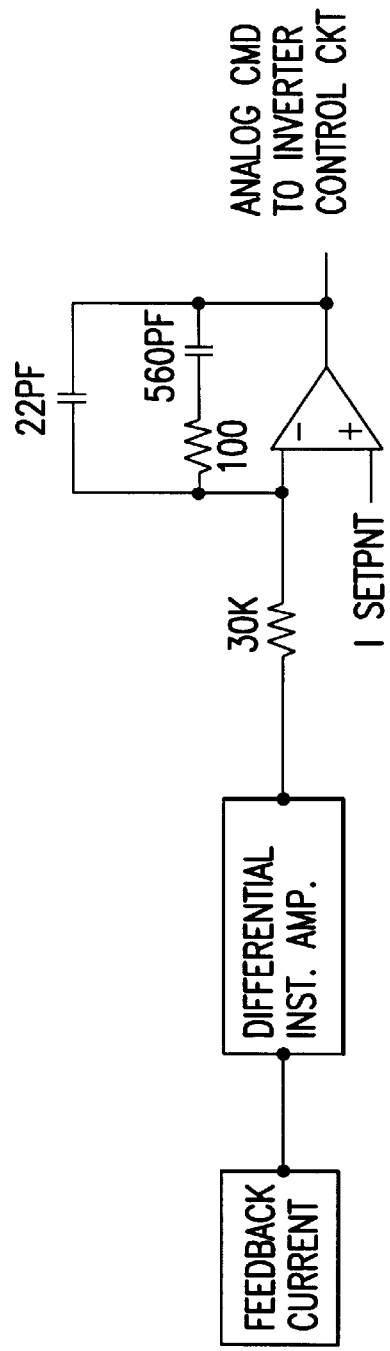

Other important improvements in this first preferred embodiment over the prior art power supplies are shown in FIG. 3. The simple buffer circuits of the prior art device have been replaced with differential instrumentation amplifiers The feedback current signal is also processed through a differential instrumentation amplifier and is compared with a current set point as shown in FIG. 3B to provide an analog command signal to the inverter control circuit. This comparator circuit is a standard prior art comparator circuit used to create a desired "S" curve current flow during the charging cycle of the pulse (i.e., low current flow at the beginning and end and high current flow in the middle of the cycle).

Reduction of Charge Current Slope

Figure 4:
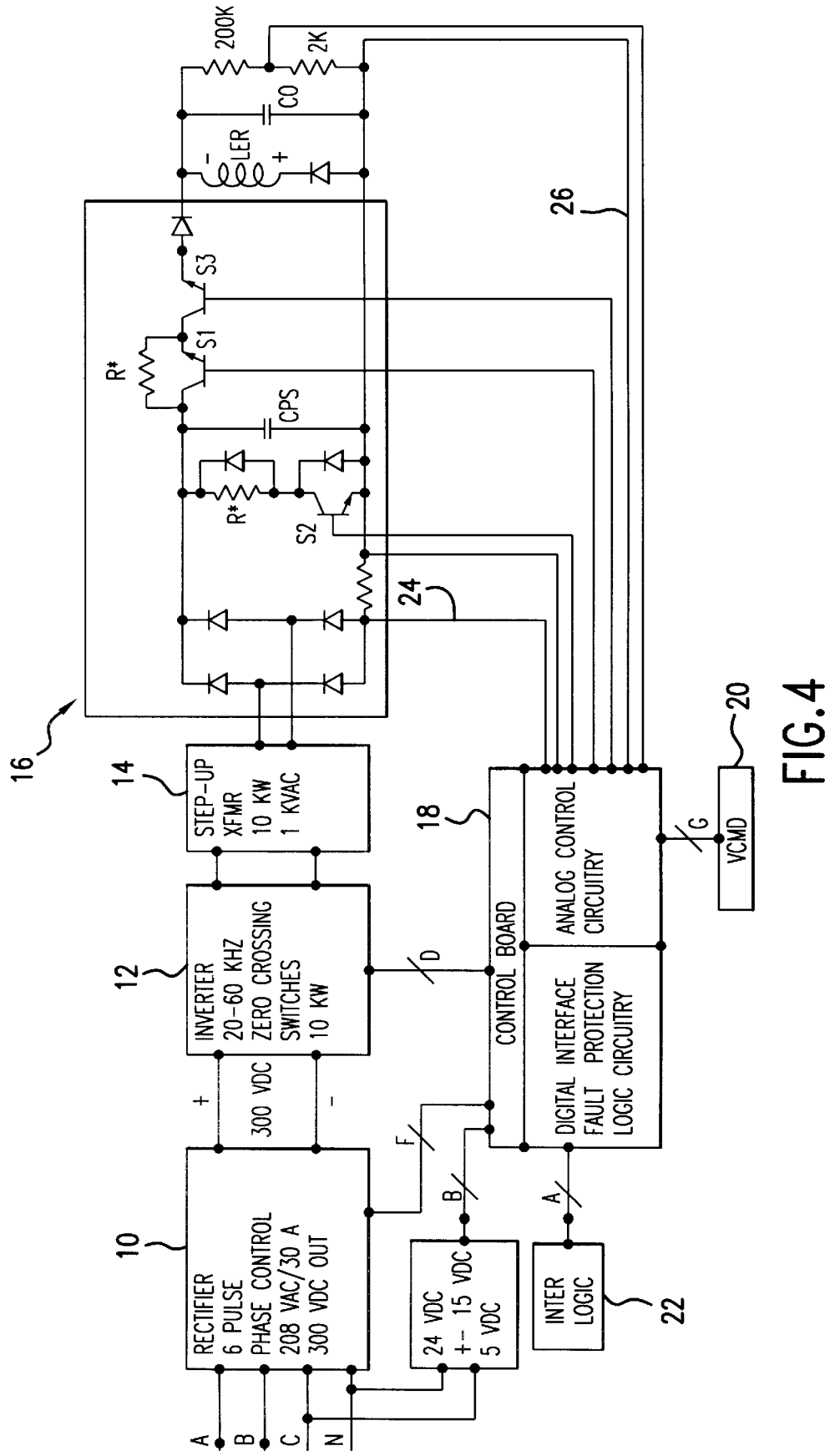
FIG. 4 is a circuit diagram showing additional features of the present invention.

The charge rate of Co is very fast, about 600 volts in about 0.5 milliseconds. Therefore, for a constant charge rate, the timing of the firing of shunt switch S2 and the stopping of the operation of inverter 12 is extremely critical. To relax this timing requirement, Applicants have modified the power supply circuitry to reduce the effective frequency and amplitude of the current charging Co during the last approximately 5 percent of the charge cycle. To do this, Applicants added a resistor circuit in rectifier unit 16. A 20 ohm non-inductive resistor R* replaced the regular 20 ohm shunt resistor in rectifier 16. Also, a second 20 ohm non-inductive resistor R* is inserted into the circuit by the opening of switch S1 as shown in FIG. 4 during the last few inverter cycles of the charge cycle. This is accomplished by a control circuit (not shown) which is essentially the same as the one shown in FIG. 3A. This circuit also uses the converted command signal after it has been changed to analog and the Vfb signal, but the command signal is attentuated by about 5 percent with a resistor divider circuit so that the extra resistance is added when the voltage is at about 95% of the command voltage. The resulting signal is used to open S1 a few microseconds prior to the voltage on Co reaching its desired value. These changes proved that the frequency of the current charging Co could be reduced by a factor of about 2 and the amplitude could be reduced by a factor of 3 to 4 during the last 5 percent of the charging cycle. The result of the decrease in frequency and amplitude produced a significant reduction of the charge current flow for the final few inverter cycles of the charge and this permits a much more precise shut off of the charging cycle as compared to the prior art circuit. The effect is similar to the slow down toward the end of the fill at the self service gasoline pump.

Results

Figure 1:
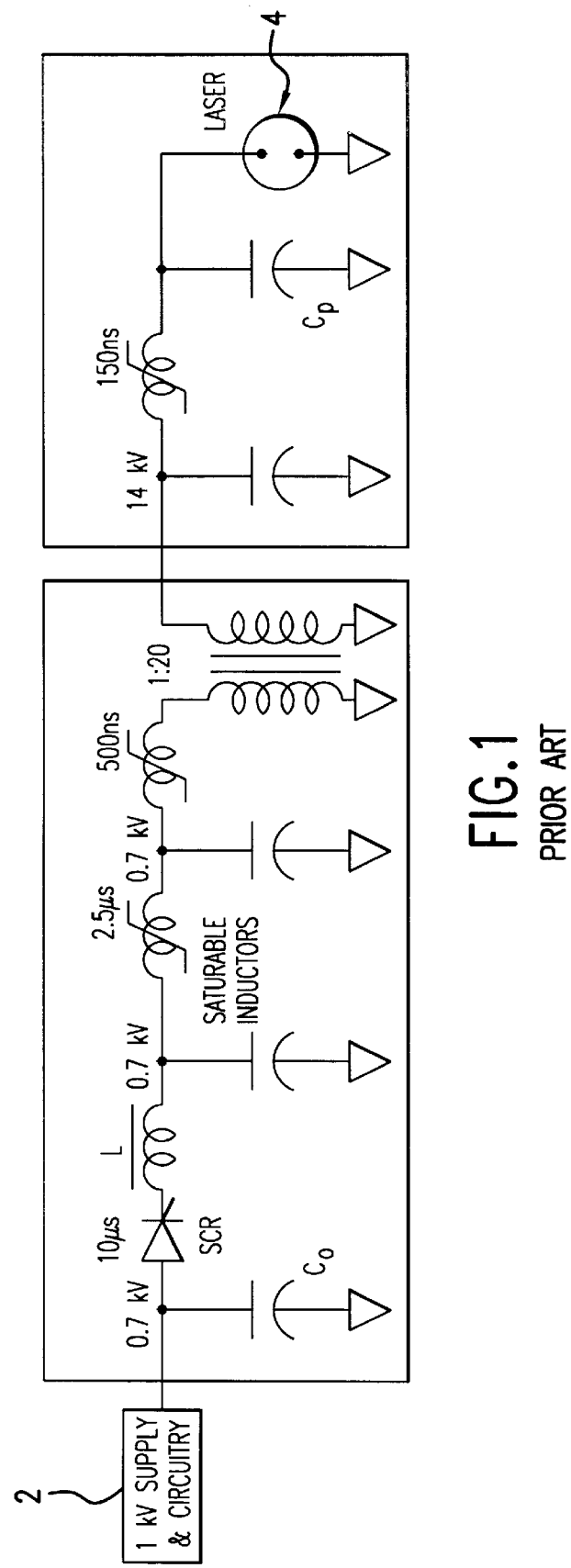
FIG. 1 shows a prior art laser electrical circuit.
Figure 5A:
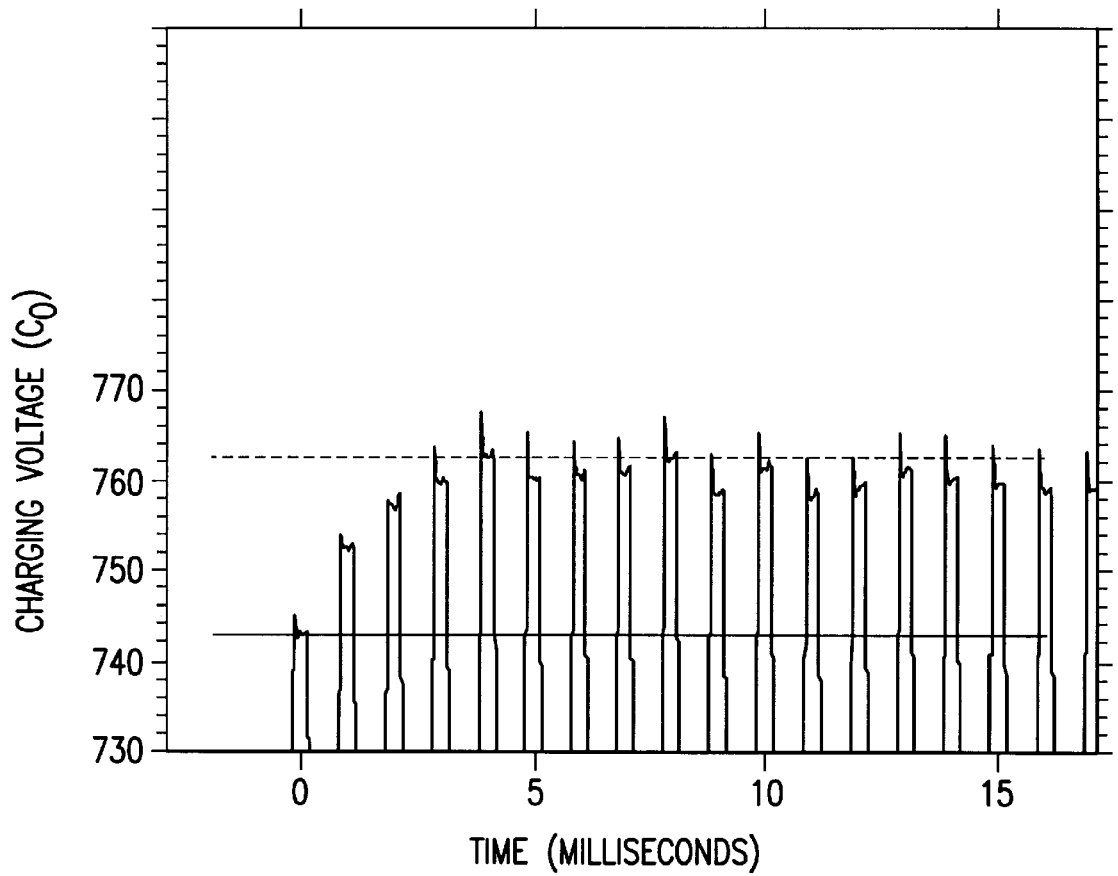
FIGS. 5A through 5E are charts showing test data with various embodiments of the present invention in place.
Figure 5B:
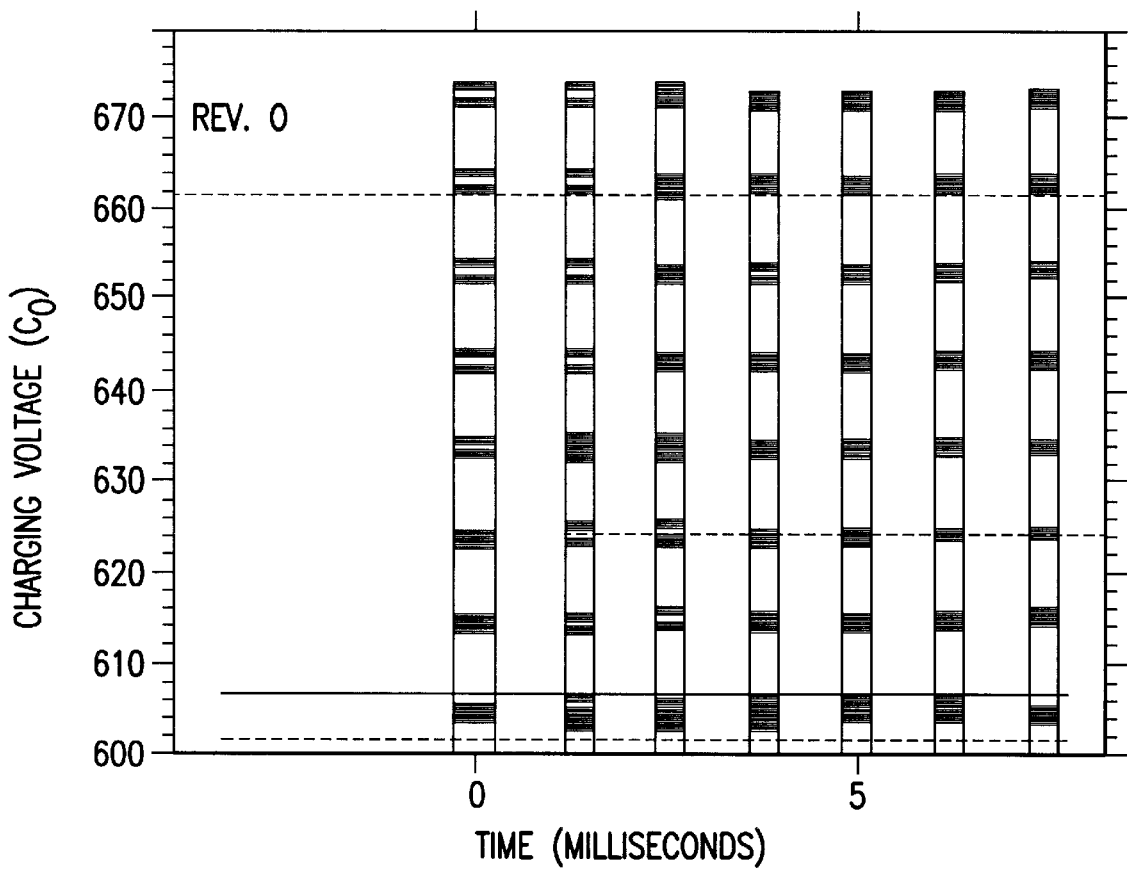
Figure 5C:
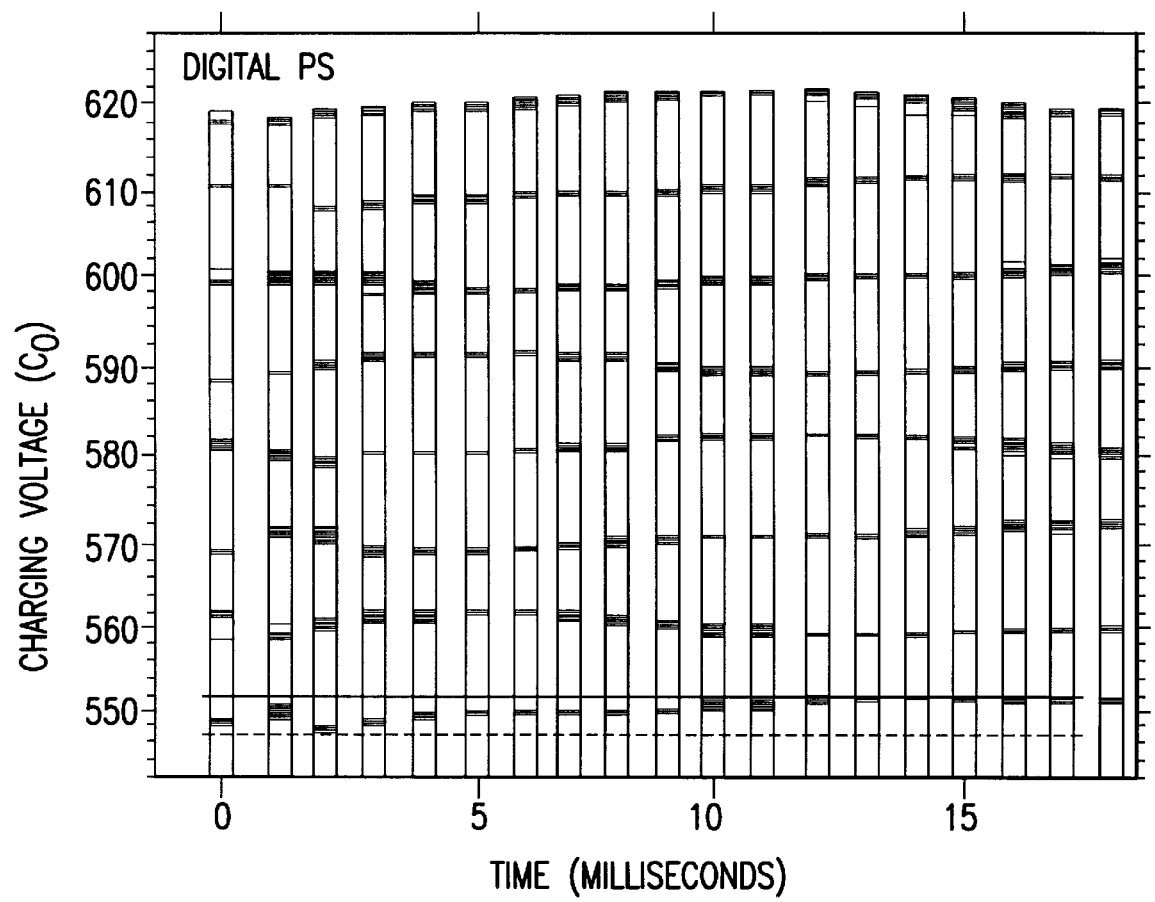
Figure 5D:
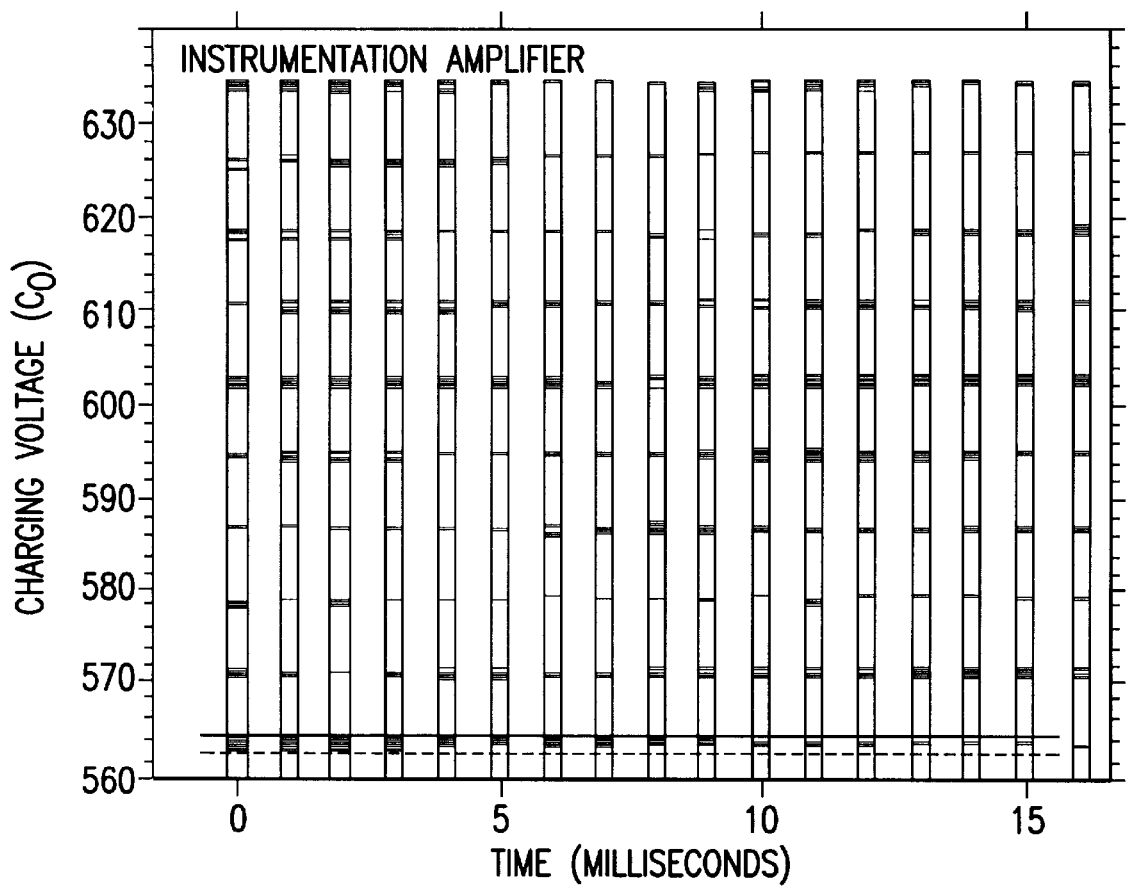
Figure 5E:
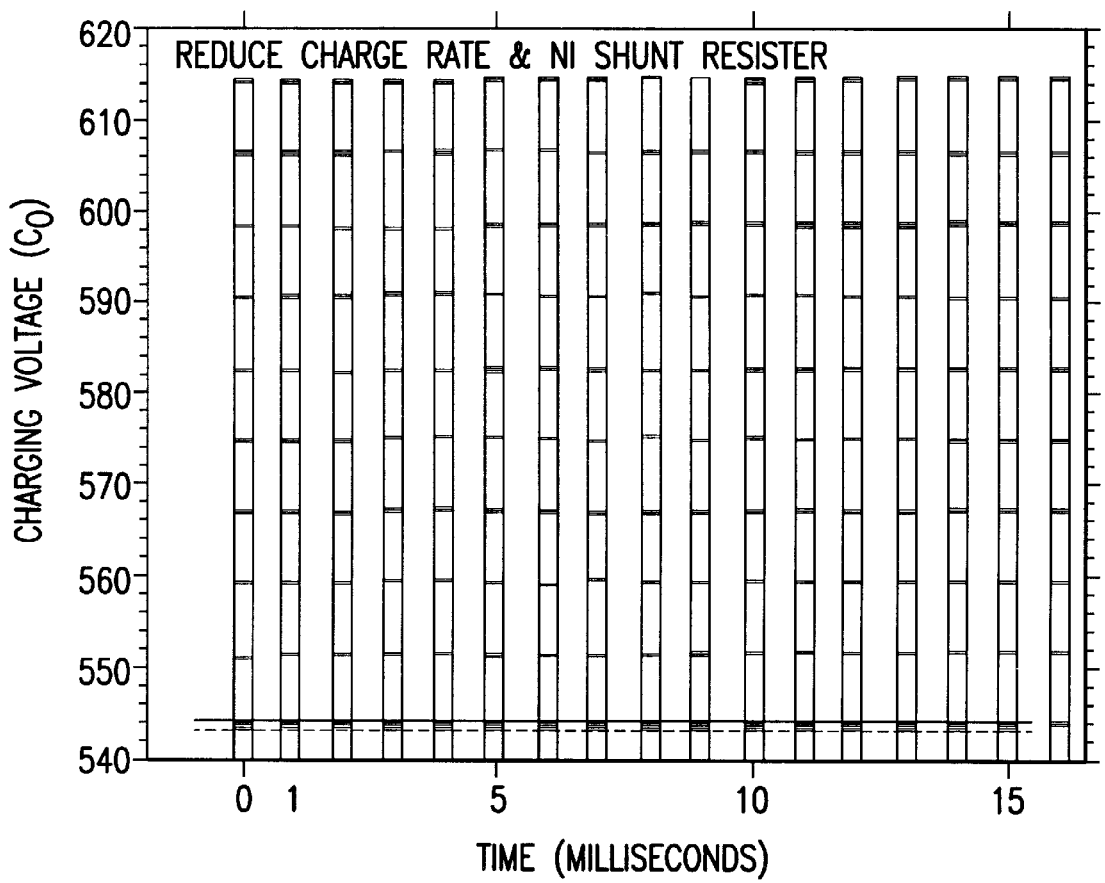

The results of the improvements discussed above are shown in FIGS. 5A through 5E. FIG 5A shows the variation of the output of the power supply which is the charge on capacitor Co as shown in FIG. 1, FIG. 2A and FIG. 4. The performance of the prior art power supply is shown in FIG. 5A. In this test, the power supply is commanded to produce 750 volts in a burst mode at 1000 Hz. FIG. 5A shows a transient of about 20 volts. FIG. 5B shows the results of the Rev O circuit changes to reduce the adverse effects of the control circuit resonant frequency. The figure is a printout showing the results of ten bursts at each of 8 voltages (about 600 volts to about 670 volts). Each burst consisted of seven pulses at 1000 Hz. The recorded charging voltages are superimposed so that dither can be easily detected. Dither is the variation of voltages between bursts (i.e., how much does the third pulse of a burst vary from the third pulse of other bursts). FIG. 5C shows the result of digitizing the voltage command signal. FIG. 5D shows the effect of the addition of the differential instrumentation amplifiers and FIG. 5E shows the effects of reducing the charge rate at the end of the charge cycle and adding the non-inductive resistors in rectifier 16. The results are summarized as follows:

| Change | Transient | Dither |
|---|---|---|
| Prior Art | 19.8 Volts | No Data |
| Rev O | 5 Volts | 3 Volts |
| Digital Voltage Command | 4.2 Volts | 2 Volts |
| Differential Instrumentation Amplifier | 0 Volts | 1.8 Volts |
| Red. End Charge Rate & NI Resistors | 0 Volts | 1 Volts |

While the invention has been described in detail herein in accord with certain preferred embodiments thereof, many modifications and changes therein may be effected by those skilled in the art. For example, other types of rectifiers could be substituted for the specified silicon control rectifier 10 and the diode rectifier 16 shown in FIG. 2A. Accordingly, it is intended by the appended claims to cover all such modifications and changes as fall within the true spirit and scope of the invention.

What is claimed is:

1. An excimer laser comprising:
A. A laser chamber,
B. A laser gas disposed within said laser chamber said laser gas comprising:
  (1) a halogen gas,
  (2) a nobel gas,
  (3) a buffer gas,
C. At least two elongated electrodes disposed within said laser chamber,
D. A high voltage pulse power supply supplying high voltage pulses across said electrodes said high voltage power supply comprising:
  (1) A pulse power supply having fine digital regulation and defining a charging cycle, said power supply comprising:
    a) a first rectifier providing a direct current output,
    b) an inverter for converting the output of said first rectifier to high frequency first alternating current at a first alternating current voltage,
    c) a step up transformer for amplifying the output voltage of said inverter to produce a second alternating current at a second alternating current voltage,
    d) a second rectifier for rectifying said second alternating current voltage,
    e) a control board comprising electronic circuits to control said power supply to provide high voltage pulses at a frequency of at least about 1000 Hz,
    f) a voltage feedback circuit comprising a voltage detection circuit for detecting the voltage output of said second rectifier and providing a voltage output signal to said control board,
    g) a current feedback circuit comprising a current detection circuit for detecting charging current flowing from said second rectifier and providing a charging current signal to said control board,
    h) a digital command control for providing command control to said control board; and
  (2) a magnetic switch for compressing and amplifying output electrical pulses from said pulse power supply.

2. An excimer laser as in claim 1 wherein said first rectifier is a silicon controlled rectifier.

3. An excimer laser as in claim 1 wherein said second rectifier is an output stage diode rectifier.

4. An excimer laser as in claim 1 wherein said voltage feedback circuit comprises a differential instrumentation amplifier.

5. An excimer laser as in claim 1 wherein said current feedback circuit comprises a differential instrumentation amplifier.

6. An excimer laser as in claim 1 wherein said second alternating current defines a resonant frequency and further comprising a resistor circuit and a switch means for forcing said charging current through said resistor circuit in order to decrease the resonant frequency near the end of each charging cycle.

7. An excimer laser as in claim 6 wherein said resistor circuit comprises at least one non-inductive resistor.

8. An excimer laser as in claim 7 wherein said output stage diode rectifier comprises a non-inductive shunt resistor.

9. An excimer laser comprising:
A. A laser chamber,
B. A laser gas disposed within said laser chamber said laser gas comprising:
  1) a halogen gas,
  2) a nobel gas,
  3) a buffer gas,
C. At least two elongated electrodes disposed within said laser chamber,
D. A high voltage pulse power supply supplying high voltage pulses across said electrodes said high voltage power supply comprising:
  (1) A pulse power supply having fine digital regulation and defining a charging cycle, said power supply comprising:
    a. a silicon controlled rectifier providing a direct current output,
    b. an inverter for converting the output of said silicon controlled rectifier to high frequency alternating current at a first alternating current voltage,
    c. a step up transformer for amplifying the output voltage of said inverter to provide a second alternating current voltage,
    d. an output stage diode rectifier for rectifying said second alternating current voltage, said output stage rectifier comprising a non-inductive shunt register and an end of charging cycle resistor circuit comprising a non-inductive resistor,
    e. a control board comprising electronic control circuits to control said power supply to provide high voltage pulses at a frequency of at least 1000 Hz,
    f. a voltage feedback circuit comprising a voltage detection circuit for detecting the voltage output of said output stage rectifier and providing a voltage output signal through a differential amplifier to said control circuits of said control board,
g. a current feedback circuit comprising a current detection circuit for detecting charging current flowing in said output stage diode rectifier and providing a charging current signal through a differential amplifier to said control circuits to said control board,
h. a digital command control for providing command control to said control board,
i. a control circuit for determining when the charging cycle is nearly over and for causing said charging voltage to flow through said end of charging cycle resistor circuit, and (2) A magnetic switch for compressing and amplifying output electrical pulses from said pulse power supply.

* * * * *